United States Patent
Cho et al.

(10) Patent No.: US 6,525,870 B1
(45) Date of Patent: Feb. 25, 2003

(54) METHOD AND SYSTEM FOR CONTROLLING RAMAN GAIN FLATNESS SENSITIVITY TO PUMP LASER WAVELENGTH VARIATION

(75) Inventors: Si Hyung Cho, Silver Spring, MD (US); Jon Tsou, Baltimore, MD (US); Jun Bao, Ellicott City, MD (US); Balakrishnan Sridhar, Ellicott City, MD (US)

(73) Assignee: Ciena Corporation, Linthicum, MD (US)

( * ) Notice: Subject to any disclaimer, the term of this patent is extended or adjusted under 35 U.S.C. 154(b) by 0 days.

(21) Appl. No.: 09/916,075

(22) Filed: Jul. 26, 2001

(51) Int. Cl.$^7$ .................................................. H01S 3/00
(52) U.S. Cl. ................................... 359/334; 359/341.3
(58) Field of Search ............................. 359/334, 341.3, 359/341.33

(56) References Cited

U.S. PATENT DOCUMENTS

| | | | |
|---|---|---|---|
| 4,699,452 A | 10/1987 | Mollenauer et al. | 350/96.16 |
| 5,159,601 A | * 10/1992 | Huber | 372/6 |
| 5,673,129 A | 9/1997 | Mizrahi | 359/124 |
| 5,875,273 A | 2/1999 | Mizrahi et al. | 385/37 |
| 5,943,152 A | 8/1999 | Mizrahi et al. | 359/187 |
| 6,091,744 A | 7/2000 | Sorin et al. | 372/20 |
| 6,115,174 A | 9/2000 | Grubb et al. | 359/334 |
| 6,118,914 A | 9/2000 | Davis et al. | 385/37 |
| 6,163,552 A | 12/2000 | Engelberth et al. | 372/3 |
| 6,389,200 B1 | * 5/2002 | Foltzer | 385/37 |

FOREIGN PATENT DOCUMENTS

| | | | |
|---|---|---|---|
| EP | 0867736 A2 | * | 9/1998 |
| WO | WO 97/31289 | * | 8/1997 |

OTHER PUBLICATIONS

Raman Amplification in Wideband WMD Transmission, Web ProForum Tutorial, International Engineering Consortium, date unknown.

Jiang et al, "A Novel Strain–Induced Thermally Tuned Long–Period Fiber Grating Fabricated on a Periodic Corrugated Silicon Fixture" (2002), IEEE Photonics Technology Letters, vol. 14, No. 7, pp 941–943.*

* cited by examiner

*Primary Examiner*—Mark Hellner
(74) *Attorney, Agent, or Firm*—Michael R. Cammarata; David A. Fox

(57) ABSTRACT

An exemplary embodiment of the invention is a Raman amplifier for use in an optical communications network. The Raman amplifier includes a plurality of pump lasers and a plurality of wavelength control modules, each associated with one of the pump lasers. Each wavelength control module includes a fiber Bragg grating optically coupled to a respective one of the plurality of pump lasers. The fiber Bragg grating receives a pump laser output from one of the pump lasers and generates a wavelength control module output. A temperature sensor is in thermal contact with the fiber Bragg grating and generates a temperature signal indicative of a temperature of the fiber Bragg grating. A controller is operatively connected to the temperature sensor and generates a control signal in response to the temperature signal. A thermal regulator is in thermal contact with the fiber Bragg grating and adjusts the temperature of the fiber Bragg grating in response to the control signal. The controller adjusts the temperature of the fiber Bragg grating to reduce sensitivity of Raman gain flatness to variation in a wavelength of the pump laser output.

13 Claims, 6 Drawing Sheets

METHOD AND SYSTEM FOR CONTROLLING RAMAN GAIN FLATNESS SENSITIVITY TO PUMP LASER WAVELENGTH VARIATION

BACKGROUND OF THE INVENTION

1. Field of Invention

The invention relates generally to a method and system for controlling Raman gain flatness sensitivity to pump laser wavelength variations in an optical communications system utilizing Raman amplification.

2. Description of Related Art

Raman amplifiers are used in optical communications networks in applications such as ultra long haul transmissions. Energy from pump lasers is transferred to the signal carrying wavelengths through stimulated Raman scattering (SRS) to thereby amplify the signal.

In wavelength division multiplexed (WDM) systems, it is known to be desirable to provide uniform gain across multiple channels, a concept referred to as gain flatness. Unfortunately, conventional Raman amplifiers may generate non-uniform gain due to a number of factors. First, the pump lasers will have variance in the output wavelength due to manufacturing tolerances. Typically, pump laser manufacturers can deliver pump lasers with ±1.0 nm tolerance at room temperature (25° C.). In addition to pump laser wavelength tolerances, the temperature dependence of Raman amplifier components can shift the pump laser wavelength significantly over −5° C. to 55° C. ambient temperature. Existing Raman amplifiers may experience a temperature dependence of ~0.02 nm/° C., which corresponds to a ~1.2 nm shift over −5° C. to 55° C. ambient temperature. Thus, the worst case of pump laser wavelength deviation can be ±1.6 nm with the combination of wavelength tolerances from pump manufacturers and temperature dependent effects on laser wavelength.

FIG. 1 illustrates the deleterious effect of wavelength variance on gain flatness. As shown in FIG. 1, the Raman gain varies widely with variance in pump laser wavelength. These wavelength variances degrade the distributed Raman amplifier performance due to the increased gain ripple (i.e., reduced gain flatness) and eventually limit the transport distance of signals on the transmission path.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

SUMMARY OF THE INVENTION

An exemplary embodiment of the invention is a Raman amplifier for use in an optical communications network. The Raman amplifier includes a plurality of pump lasers and a plurality of wavelength control modules, each associated with one of the pump lasers. Each wavelength control module includes a fiber Bragg grating optically coupled to a respective one of the plurality of pump lasers. The fiber Bragg grating receives a pump laser output from one of the pump lasers and generates a wavelength control module output. A temperature sensor is in thermal contact with the fiber Bragg grating and generates a temperature signal indicative of a temperature of the fiber Bragg grating. A controller is operatively connected to the temperature sensor and generates a control signal in response to the temperature signal. A thermal regulator is in thermal contact with the fiber Bragg grating and adjusts the temperature of the fiber Bragg grating in response to the control signal. The controller adjusts the temperature of the fiber Bragg grating to reduce sensitivity of Raman gain flatness to variation in a wavelength of the pump laser output.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

The expression "optically communicates" as used herein refers to any connection, coupling, link or the like by which optical signals carried by one optical system element are imparted to the "communicating" element. Such "optically communicating" devices are not necessarily directly connected to one another and may be separated by intermediate optical components or devices. Likewise, the expressions "connection" and "operative connection" as used herein are relative terms and do not require a direct physical connection.

Figure 1:
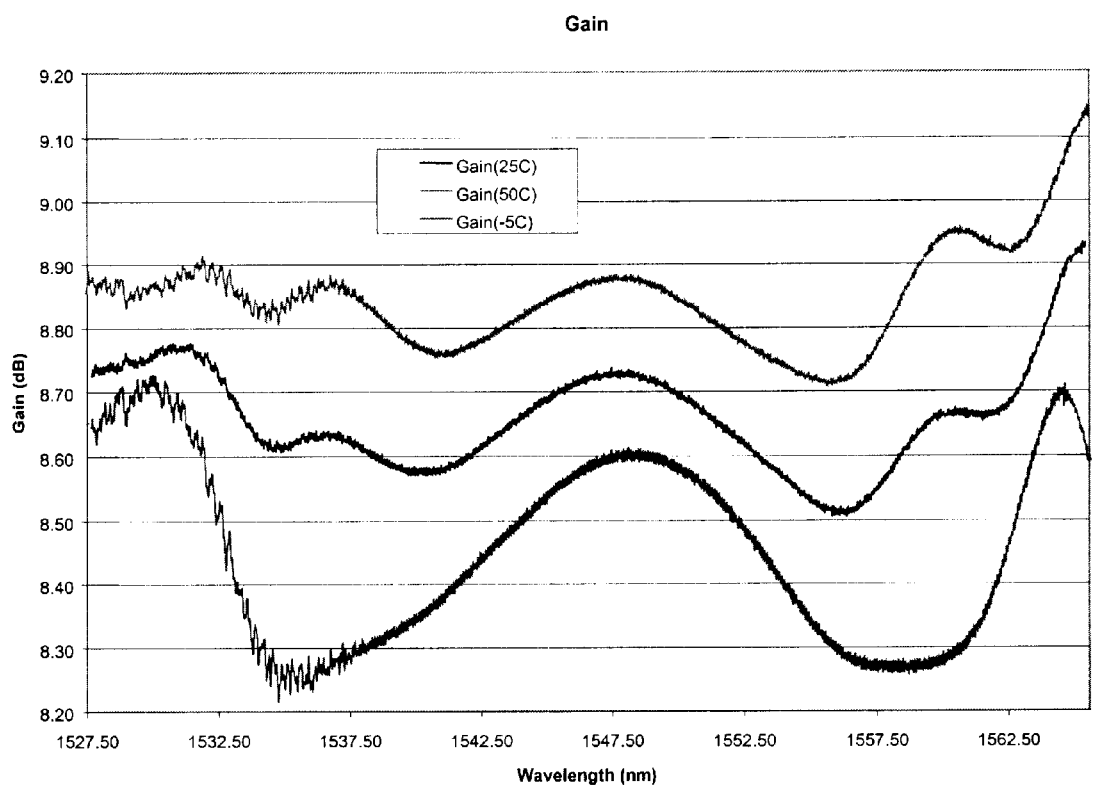
FIG. 1 is a plot of gain versus wavelength for conventional Raman amplifiers.
Figure 2:
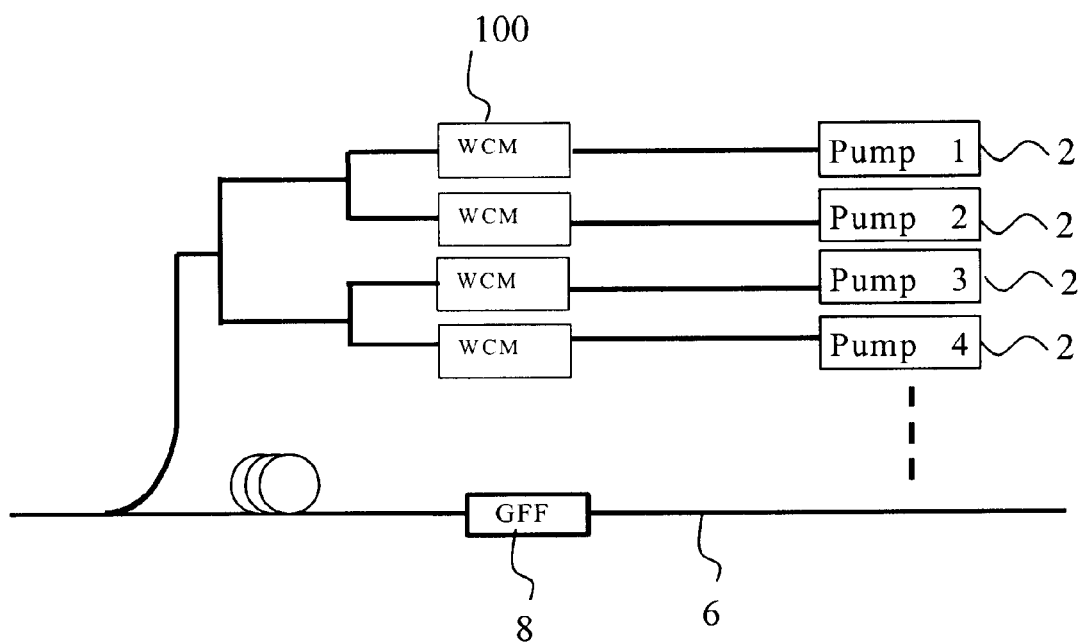
FIG. 2 is a block diagram of a portion of an optical communications system in an embodiment of the invention.

FIG. 2 is a block diagram of a portion of an optical communications system in an embodiment of the invention. The system includes a Raman amplifier which includes a number of pump lasers 2, each optically coupled to a wavelength control module 100. Typically, each pump laser 2 outputs a different wavelength and the combination of the pump laser outputs provides Raman amplification for a band of channels on transmission path 6. The outputs from the wavelength control modules 100 are combined and applied to a transmission path 6 through known techniques (e.g., couplers). Energy from the pump lasers 2 is transferred to the signal carrying wavelengths through stimulated Raman scattering to thereby amplify the signal. The pump laser energy may be applied in a co-propagating or counter-propagating manner as known in the art. The transmission path may include a variety of active and/or passive components such as gain flattening filter 8.

It is desirable to provide uniform gain across multiple channels in WDM transmission systems. Using known techniques, the power and wavelength of each pump laser 2 are selected so that substantially uniform gain (i.e., gain flatness) is provided across multiple channels in a WDM system. As noted above, pump laser wavelength variations due to pump laser tolerances and temperature variances reduce gain flatness. The wavelength control modules 100 reduce gain flatness sensitivity to pump laser wavelength variance.

Figure 3:
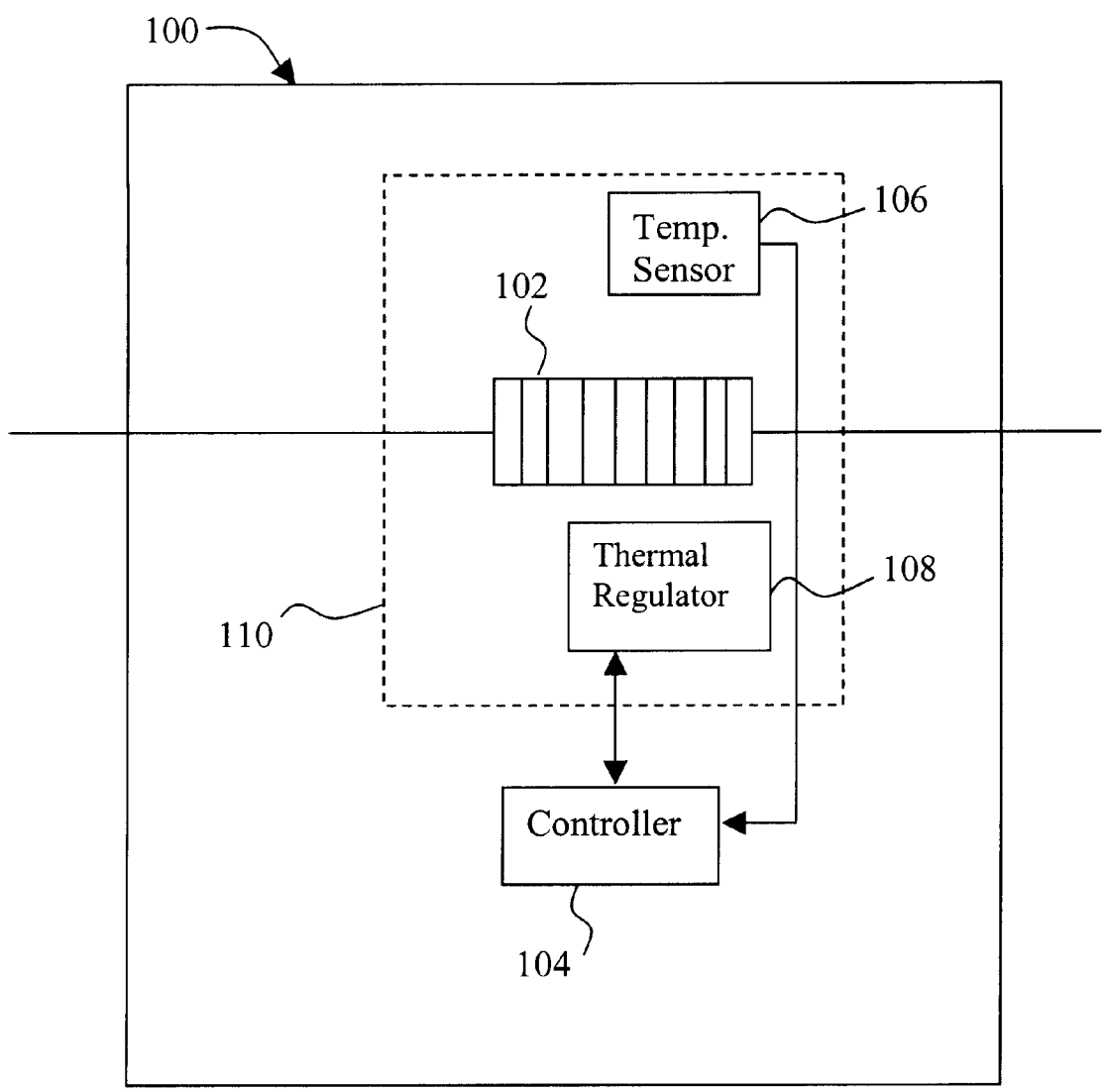
FIG. 3 is a block diagram of a wavelength control module in an exemplary embodiment of the invention.

FIG. 3 is a block diagram of a wavelength control module 100 in an exemplary embodiment of the invention. Each wavelength control module 100 includes a fiber Bragg grating 102. A thermal regulator 108 is placed proximate to and in thermal contact with the fiber Bragg grating 102 to control the temperature of the fiber Bragg grating 102. The thermal regulator 108 may be implemented using conventional devices such as a peltier heater/cooler, a resistive heater or a refrigerant based heater/cooler.

A temperature sensor 106 is placed proximate to and in thermal contact with the fiber Bragg grating 102 and generates a temperature signal which is used by a controller 104 to adjust the thermal regulator 108. The controller 104 may be implemented using known control devices such as microprocessor-based controllers. The controller 104 may be set to maintain the fiber Bragg grating 102 at a predetermined temperature or within a predetermined temperature range. When the temperature signal indicates that the fiber Bragg grating 102 is not at the appropriate temperature, the controller 104 provides the appropriate control signal to thermal regulator 108 to increase or decrease the temperature of the fiber Bragg grating 102 accordingly.

Although one controller 104 is depicted in a wavelength control module 100, it is understood that a single controller may be associated with more than one fiber Bragg grating. For example, a single controller 104 may monitor and adjust the temperature of multiple fiber Bragg gratings 102.

The fiber Bragg grating 102, thermal regulator 108 and temperature sensor 106 may be encased in a thermally conductive medium such as a gel-like potting compound 110 with proper viscous and thermal conductivity properties. Embedding the fiber Bragg grating 102 in a gel-like compound provides thermal stability.

Figure 4:
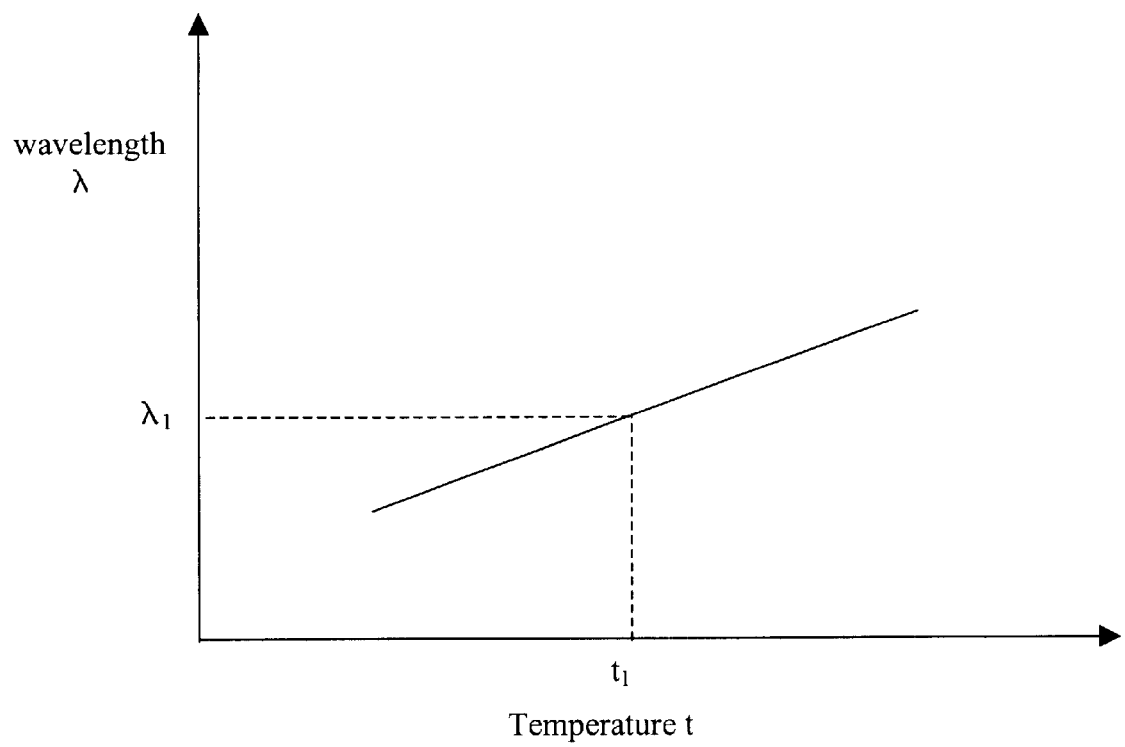
FIG. 4 is a plot of output wavelength versus temperature for a fiber Bragg grating.

In operation, the controller 104 is programmed to maintain the fiber Bragg grating 102 at a predetermined set point or within a temperature range. The desired temperature will be based on the characteristics of the fiber Bragg grating 102. The wavelength transmitted by the fiber Bragg grating 102 is dependent on the temperature of the grating. FIG. 4 depicts an exemplary transmission profile for a fiber Bragg grating 102 illustrating that a variance in temperature will cause a variation in transmitted wavelength. Thus, the wavelength control module 100 maintains the fiber Bragg grating 102 at a desired temperature (e.g., $t_1$) so that wavelength output by the fiber Bragg grating 102 remains substantially constant (e.g., $\lambda_1$). Controlling the temperature of the fiber Bragg grating 102 reduces the gain flatness sensitivity to variations in pump laser wavelength. In this way, the gain flatness is less susceptible to pump laser wavelength drifts due to tolerances or temperature variations.

Figure 5:
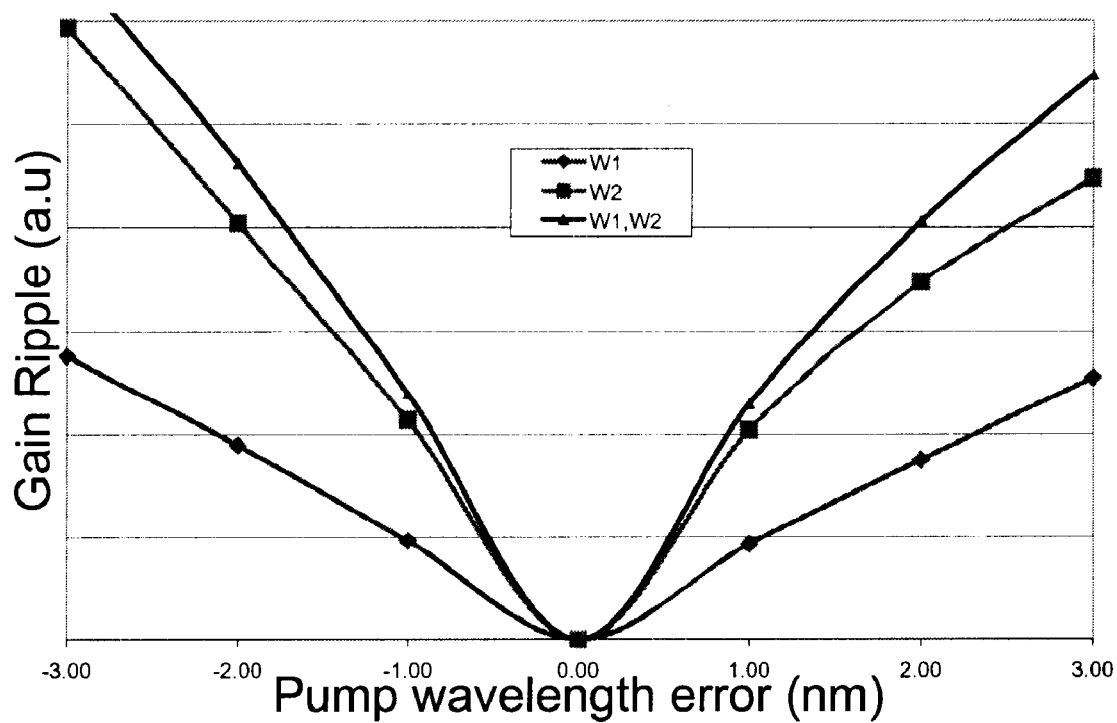
FIG. 5 is a plot of gain ripple versus pump wavelength error.

FIG. 5 is a plot of gain ripple versus pump laser wavelength error for wavelength W1, wavelength W2 and total gain ripple when both wavelengths WI and W2 are used as pump lasers. Pump laser wavelength error corresponds to the deviation between the wavelength output by the pump laser and a desired wavelength. The wavelength control module 100 improves Raman gain flatness sensitivity to such pump wavelength errors.

Figure 6:
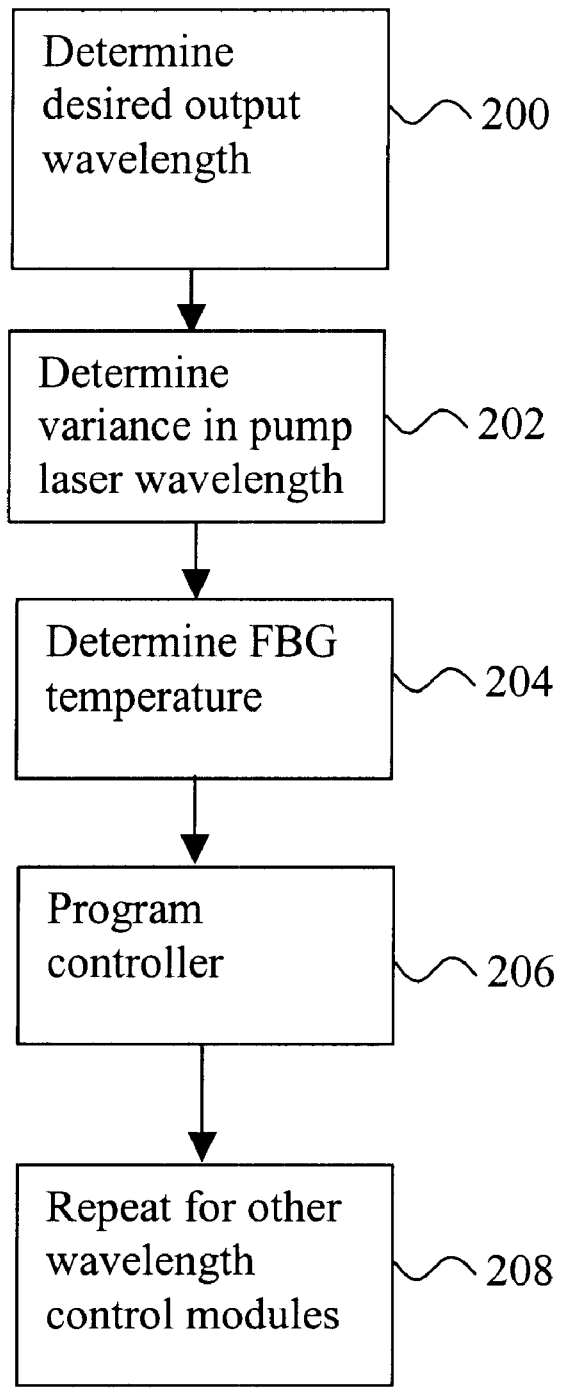
FIG. 6 is a flowchart of an exemplary process for configuring a wavelength control module.

FIG. 6 illustrates an exemplary method of configuring a wavelength control module 100. The process begins at step 200 where a desired pump laser wavelength is determined. The desired wavelength may be dictated by transmission characteristics of the optical communications network. For WDM systems, power and wavelength of multiple pump lasers are selected to provide a flat gain across multiple WDM channels. For suitable Raman amplification, the pump laser wavelength should be below the wavelength of the signals on transmission path 6. For instance, for signal transmitted on a wavelength of 1560 nm, the appropriate pump radiation would have a wavelength between about 1430 nm and 1540 nm, with peak amplification taking place for a pump wavelength of about 1460 nm.

Once the desired wavelength for the pump laser is determined, flow proceeds to step 202 where variance in the pump laser wavelength is determined. One such source of variance may be attributable to output tolerances of the pump laser. For example, the pump laser may generate an output wavelength that is 0.5 nm above the specified pump laser output wavelength. Although this difference may be within the manufacturer's tolerance, such wavelength variation will create gain ripple. Another source of wavelength variation is the temperature dependence of pump laser components.

Once the variance in the pump laser wavelength is determined, a temperature for the fiber Bragg grating 102 is determined at step 204. This desired temperature may be derived from calibration data provided with the fiber Bragg grating (e.g., from the grating supplier) or calibration data obtained empirically. The temperature is selected so that variations in pump laser wavelength will not significantly impact the Raman gain flatness.

Once the desired fiber Bragg grating temperature is determined, the controller 104 of wavelength control module 100 is programmed at step 206. The controller may be programmed to maintain the fiber Bragg grating 102 at the desired temperature set point or within a range (e.g., +/−1° C.) of the desired temperature. The programming of the controller 104 may be performed once upon manufacturing of the wavelength control module 100. Alternatively, the controller 104 may be updated in the field by storing the desired temperature in a rewritable memory such as EEPROM. The process is repeated for other wavelength control modules 100 as indicated at step 208.

The wavelength control module 100 reduces Raman gain flatness sensitivity to pump laser wavelength variations by controlling temperature of the fiber Bragg grating 102. Providing a wavelength control module 100 for each pump laser 2 provides for independent control of each pump laser output.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

What is claimed is:

1. A Raman amplifier for use in an optical communications network, the Raman amplifier comprising:
   a plurality of pump lasers;
   a plurality of wavelength control modules, each wavelength control module associated with one of said pump lasers, each wavelength control module including:
      a fiber Bragg grating optically coupled to a respective one of said plurality of pump lasers, said fiber Bragg grating receiving a pump laser output from said one of said plurality of pump lasers and generating a wavelength control module output;

a temperature sensor in thermal contact with said fiber Bragg grating, said temperature sensor generating a temperature signal indicative of a temperature of said fiber Bragg grating;

a controller operatively connected to said temperature sensor, said controller generating a control signal in response to the temperature signal; and a thermal regulator in thermal contact with said fiber Bragg grating, said thermal regulator adjusting the temperature of said fiber Bragg grating in response to the control signal;

wherein said controller adjusts the temperature of said fiber Bragg grating to reduce sensitivity of Raman gain flatness to variation in a wavelength of the pump laser output.

2. The Raman amplifier of claim 1 wherein said controller maintains said fiber Bragg grating at a predetermined temperature.

3. The Raman amplifier of claim 1 wherein said controller maintains said fiber Bragg grating within a predetermined temperature range.

4. The Raman amplifier of claim 1 further comprising a thermally conductive medium encasing said fiber Bragg grating and said thermal regulator.

5. The Raman amplifier of claim 1 further comprising a thermally conductive medium encasing said fiber Bragg grating and said temperature sensor.

6. The Raman amplifier of claim 1 wherein the variation in the wavelength of the pump laser output is due to temperature.

7. The Raman amplifier of claim 1 wherein the variation in the wavelength of the pump laser output due to pump laser tolerance.

8. A Raman amplifier for use in an optical communications network, the Raman amplifier comprising:

a plurality of pump lasers;

a plurality of wavelength control modules, each wavelength control module associated with one of said pump lasers, each wavelength control module including:

a fiber Bragg grating optically coupled to a respective one of said plurality of pump lasers, said fiber Bragg grating receiving a pump laser output from said one of said plurality of pump lasers and generating a wavelength control module output;

a temperature sensor in thermal contact with said fiber Bragg grating, said temperature sensor generating a temperature signal indicative of a temperature of said fiber Bragg grating; and a thermal regulator in thermal contact with said fiber Bragg grating, said thermal regulator adjusting the temperature of said fiber Bragg grating in response to a control signal;

a controller operatively connected to at least two of said wavelength control modules, said controller receiving the temperature signal from said at least two of said wavelength control modules and generating the control signal for said at least two of said wavelength control modules, wherein said controller adjusts the temperature of said fiber Bragg grating in said at least two of said wavelength control modules to reduce sensitivity of Raman gain flatness to variation in a wavelength of the pump laser output said at least two of said wavelength control modules.

9. A method for reducing sensitivity of Raman gain flatness to variations in pump laser wavelength in a Raman amplifier having a plurality of pump lasers and a plurality of wavelength control modules each including a fiber Bragg grating, the method comprising:

for each pump laser;

determining a desired pump laser output wavelength;

determining variance in the desired pump laser output wavelength;

determining a desired fiber Bragg grating temperature to compensate for the variance in the desired pump laser output wavelength; and controlling a temperature of the fiber Bragg grating in response to the desired fiber Bragg grating temperature to reduce sensitivity of the Raman gain flatness to variation in the pump laser output wavelength.

10. The method of claim 9 wherein said controlling the temperature of the fiber Bragg grating includes maintaining the temperature of the fiber Bragg grating at the desired fiber Bragg grating temperature.

11. The method of claim 9 wherein said controlling the temperature of the fiber Bragg grating includes maintaining the temperature of the fiber Bragg grating within a range of the desired fiber Bragg grating temperature.

12. The method of claim 9 wherein the variation in the pump laser output wavelength is due to temperature.

13. The method of claim 9 wherein the variation in the pump laser output wavelength is due to pump laser tolerance.

* * * * *